United States Patent [19]
Votruba et al.

[11] Patent Number: 6,107,974
[45] Date of Patent: Aug. 22, 2000

[54] APPARATUS AND METHOD OF GENERATING AN RF FIELD

[75] Inventors: Jan V. Votruba, Ridge; Charles Green, Holbrook, both of N.Y.

[73] Assignee: Fonar Corporation, Melville, N.Y.

[21] Appl. No.: 09/175,999

[22] Filed: Oct. 21, 1998

[51] Int. Cl.[7] ........................................ H01Q 1/00
[52] U.S. Cl. ........................ 343/787; 343/788; 324/318
[58] Field of Search ..................... 343/895, 787, 343/788; 324/318, 319, 322; H01Q 1/00

[56] References Cited

U.S. PATENT DOCUMENTS

| | | | |
|---|---|---|---|
| 4,642,569 | 2/1987 | Hayes et al. | 324/318 |
| 4,703,274 | 10/1987 | Kaufman et al. | 324/318 |
| 5,132,621 | 7/1992 | Kang et al. | 324/318 |
| 5,304,932 | 4/1994 | Carlson | 324/318 |
| 5,363,113 | 11/1994 | Mametsa et al. | 343/744 |
| 5,457,386 | 10/1995 | Matsunaga et al. | 324/318 |

*Primary Examiner*—Don Wong
*Assistant Examiner*—Hoang Nguyen
*Attorney, Agent, or Firm*—Rabin & Champagne, P.C.

[57] ABSTRACT

An RF antenna includes an input terminal for receiving an RF signal, a supporting element, an electrically conductive coil on the supporting element and disposed to receive the RF signal from the input terminal, and an RF shield formed of an electrically conductive material and disposed under the coil and further including contacts for connection to a ground electrical potential. The antenna generates a circularly polarized RF field. A method of generating an RF field includes generating an RF signal, providing the RF signal to an electrically conductive coil disposed on a magnet core and separated from the magnet core by a supporting element, shielding the electrically conductive coil using an electrically conductive material, and connecting the RF shield to a ground electrical potential so as to provide a current return for the RF signal through the RF shield. The supporting element may be a cross-shaped plastic spacer, which may include a first segment and a second segment, such that a first electrically conductive coil is disposed on the first segment to receive a first RF signal, and a second electrically conductive coil is disposed on the second segment to receive a second RF signal.

46 Claims, 5 Drawing Sheets

APPARATUS AND METHOD OF GENERATING AN RF FIELD

FIELD OF THE INVENTION

The present invention relates generally to magnetic resonance imaging ("MRI") scanners and nuclear magnetic resonance ("NMR") excitation of hydrogen in patients. In particular, the present invention relates to an RF antenna design and a method for providing a circularly polarized RF field for NMR excitation, utilizing an RF shield as a current return.

BACKGROUND OF THE INVENTION

Nuclear magnetic resonance imaging is utilized for scanning and imaging biological tissue as a diagnostic aid. A conventional MRI apparatus includes a primary magnet, an RF generator, and a detector. The magnetic field produced by the magnet and the RF field produced by the RF generator are applied to the subject tissue, and the resulting nuclear magnetic resonance is read by the detector. The NMR data is then processed to produce an image of the tissue.

The RF signal used in MRI is commonly produced by a transmitter coil. The conventional saddle-shaped MRI transmitter coil interferes with the useable imaging volume and makes it difficult to administer certain applications within the imaging volume. Further, the conventional transmitter coil produces a non-uniform RF field.

Newer, open-gap transmitters eliminate these problems, but further development and improvement is desirable to overcome other disadvantages in the open-gap design. For example, large coils are utilized to generate the RF field, and only a small part of the spatially extensive transmitter generates the field in the correct direction and magnitude in the scanning volume located in the center of the magnet gap. Thus, due to the inefficient design, a large percentage of the RF power is dissipated elsewhere. Also, because these transmitters generate linearly polarized fields, one-half of the generated power is lost, another source of inefficiency. The large coil size also results in the generation of high voltages, which causes discharge and arcing problems.

SUMMARY OF THE INVENTION

It is therefore an objective of the present invention to provide an RF transmitter design for NMR excitation, which does not physically interfere with the imaging volume, or "gap", of the MRI scanner.

It is another objective of the present invention to provide an RF transmitter which efficiently provides an RF field for NMR excitation.

The present invention utilizes a quadrature transmitter to generate a circularly polarized RF field. This allows the full output power to be used, with no waste. The transmitter uses the RF shielding material as a current return. The coils used to generate the field are much smaller than coils used in conventional MRI transmitters, resulting in smaller inductances and voltages and greater values of capacitance. These parameters eliminate the arcing problem associated with conventional systems. Because this is a low impedance system, it can accept a high power input signal without breaking down. The transmitter of the present invention also features a much simpler mechanical design than conventional transmitters. The field is localized in the imaging volume, eliminating fringe RF fields, further making transmission more efficient.

According to a first aspect of the present invention, an RF antenna assembly includes an input terminal for receiving an RF signal, an electrically conductive coil disposed to receive the RF signal from the input terminal, and an RF shield formed of an electrically conductive material and disposed under the coil and further including contacts for connection to a ground electrical potential. The assembly may also include an electrically non-conductive supporting element, preferably made of plastic, on which the electrically conductive coil is disposed. The supporting element may be formed in any suitable shape, such as a rectangle or a cross. The input terminal may include a first input terminal for receiving a first RF signal and a second input terminal for receiving a second RF signal, and the electrically conductive coil may include a first electrically conductive coil and a second electrically conductive coil. A cross-shaped supporting element may include a first segment and a second segment, in which case the first electrically conductive coil is disposed on the first segment to receive the first RF signal from the first input terminal, and the second electrically conductive coil is disposed on the second segment to receive the second RF signal from the second input terminal. The RF antenna may also include an amplifier section having a splitter for receiving an input signal and producing the first RF signal, and for adding a phase shift to the input signal to produce the second RF signal. Preferably, the phase shift is 90°. Alternatively, the RF antenna assembly may include an amplifier section having a phase shifter for receiving an input signal and adding a phase shift to produce the first RF signal, and an attenuator for receiving an input signal and providing attenuation to produce the second RF signal, preferably such that the amplitude of the first RF signal matches the amplitude of the second RF signal. Preferably, the phase shift and attenuation are variable.

According to another aspect of the present invention, an MRI scanner includes a magnet and an RF antenna disposed on the magnet core. The RF antenna includes an input terminal for receiving an RF signal, an electrically conductive coil disposed to receive the RF signal from the input terminal, and an RF shield formed of an electrically conductive material and disposed under the coil and further including contacts for connection to a ground electrical potential. The scanner may include a supporting element, preferably made of plastic, disposed on the magnet core, wherein the input terminal is separated from the magnet core by the supporting element. The supporting element may be formed in any suitable shape, such as a rectangle or a cross. The input terminal may include a first input terminal for receiving a first RF signal and a second input terminal for receiving a second RF signal, and the electrically conductive coil may include a first electrically conductive coil and a second electrically conductive coil. A cross-shaped supporting element may include a first segment and a second segment, in which case the first electrically conductive coil is disposed on the first segment to receive the first RF signal from the first input terminal, and the second electrically conductive coil is disposed on the second segment to receive the second RF signal from the second input terminal. The RF antenna may also include an amplifier section having a splitter for receiving an input signal and producing the first RF signal, and for adding a phase shift to the input signal to produce the second RF signal. Preferably, the phase shift is 90°. Alternatively, the RF antenna may include an amplifier section having a phase shifter for receiving an input signal and adding a phase shift to produce the first RF signal, and an attenuator for receiving an input signal and providing attenuation to produce the second RF signal, preferably such that the amplitude of the first RF signal matches the amplitude of the second RF signal. Preferably, the phase shift and attenuation are variable.

According to a further aspect of the present invention, a method of providing an RF field for MRI scanning includes generating an RF signal, providing the RF signal to an electrically conductive coil disposed on a magnet core, shielding the electrically conductive coil using an electrically conductive RF shield, and connecting the RF shield to a ground electrical potential so as to provide a current return for the RF signal through the RF shield. The electrically conductive coil may be separated from the magnet core by a supporting element, which is preferably made of plastic. The supporting element may be formed in any suitable shape, such as a rectangle or a cross. The RF signal may be a first RF signal and the electrically conductive coil a first electrically conductive coil, in which case the method also includes generating a second RF signal, providing the second RF signal to a second electrically conductive coil disposed on the magnet core and separated from the magnet core by the plastic spacer, shielding the second electrically conductive coil using the electrically conductive RF shield, and providing a current return for the second RF signal through the RF shield. A cross-shaped supporting element may include a first segment and a second segment, in which case the first electrically conductive coil is disposed on the first segment to receive the first RF signal from the first input terminal, and the second electrically conductive coil is disposed on the second segment to receive the second RF signal from the second input terminal. A circularly polarized RF field may be generated at the first and second transmitter coils. The method may also include splitting an input signal to produce the first RF signal, and adding a phase shift to the input signal to produce the second RF signal. Preferably, the phase shift is 90°. The method may also include receiving an input signal, adding a phase shift to produce the first RF signal, and providing attenuation to produce the second RF signal, preferably having an amplitude to match that of the first RF signal. Preferably, the phase shift and the attenuation are variable. Alternatively, the method of the present invention may include receiving an input signal, adding a phase shift to the input signal to produce the first RF signal, and providing attenuation to the input signal to produce the second RF signal, preferably having an amplitude to match that of the first RF signal. The phase shift and the attenuation may be adjusted so that an output field of the first and second electrically conductive coils is circularly polarized with the opposite polarity required for NMR excitation, resulting in a minimum NMR signal. After the minimum signal is achieved, the phase shift may be adjusted by 180°, reversing the phase relation of the first coil to the second coil, thereby resulting in a maximum NMR signal.

BRIEF DESCRIPTION OF THE DRAWINGS

The present invention may be more clearly understood by way of the following written description, appended claims, and drawings, in which:

DETAILED DESCRIPTION OF THE INVENTION

Figure 1:
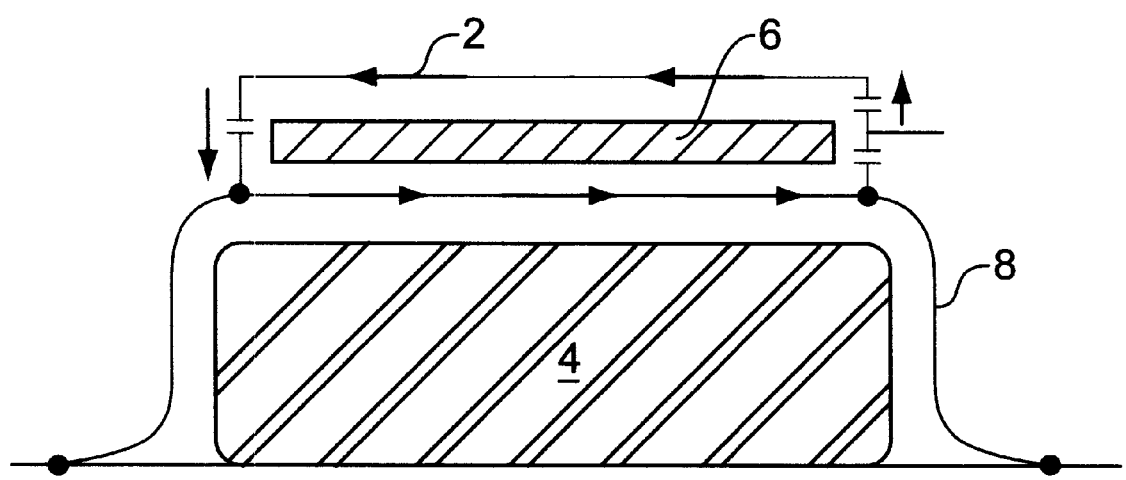
FIG. 1 shows a cross section view of the flat coil element of the present invention.

As shown in FIG. 1, a basic element of the present invention is a flat coil antenna 2 that sits atop the magnet pole 4, separated in part from the pole by a supporting element 6. When connected to a source of electrical power, the coil defines a current loop for generating the RF magnetic field, as shown by the arrows in FIG. 1. The coil includes a linear electrical conductor 3, and an antenna shield 8, which may be a conductive layer as shown in the figure; is grounded around the edges of the coil 2, so that it can function as a current return for the antenna coil 2. The supporting element 6 is preferably made of a suitable non-conductive material having low capacitive losses. Thus, the supporting element may be, for example, a plastic spacer. The supporting element 6 will be referred to as a plastic spacer 6 hereinafter for convenience only, and is not limited to this particular construction. Further, the supporting element 6 is not always necessary. That is, if the physical dimensions of the coil antenna 2 are small and if the coil is made from a rigid material, the assembly may be constructed without requiring the supporting element 6.

Figure 2:
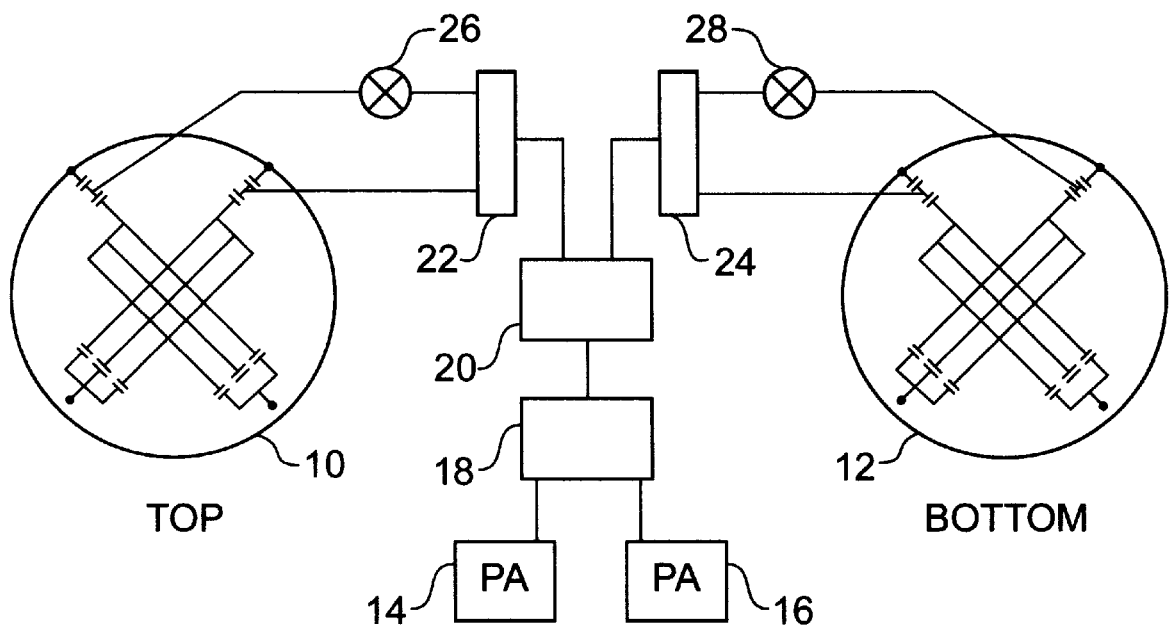
FIG. 2 shows a first embodiment of the quadrature transmitter of the present invention.

FIG. 2 is a schematic diagram of the quadrature transmitter of the present invention, showing top and bottom transmitters 10, 12 for corresponding top and bottom poles of the MRI assembly. As shown, RF energy is preferably supplied via two power amplifiers 14, 16, the outputs of which are combined at a splitter 18. Alternatively, a single power amplifier may be utilized, or any necessary amplification may be otherwise provided. The power is divided between the antennas at a second splitter 20. Each component is split again at a pair of splitters 22, 24, with one RF source for each of the top and bottom antennas undergoing a 90° phase shift at phase shifters 26, 28. The resulting circularly polarized RF field has inphase and quadrature components generated by corresponding segments of the cross-shaped antennas 10, 12.

Figure 3:
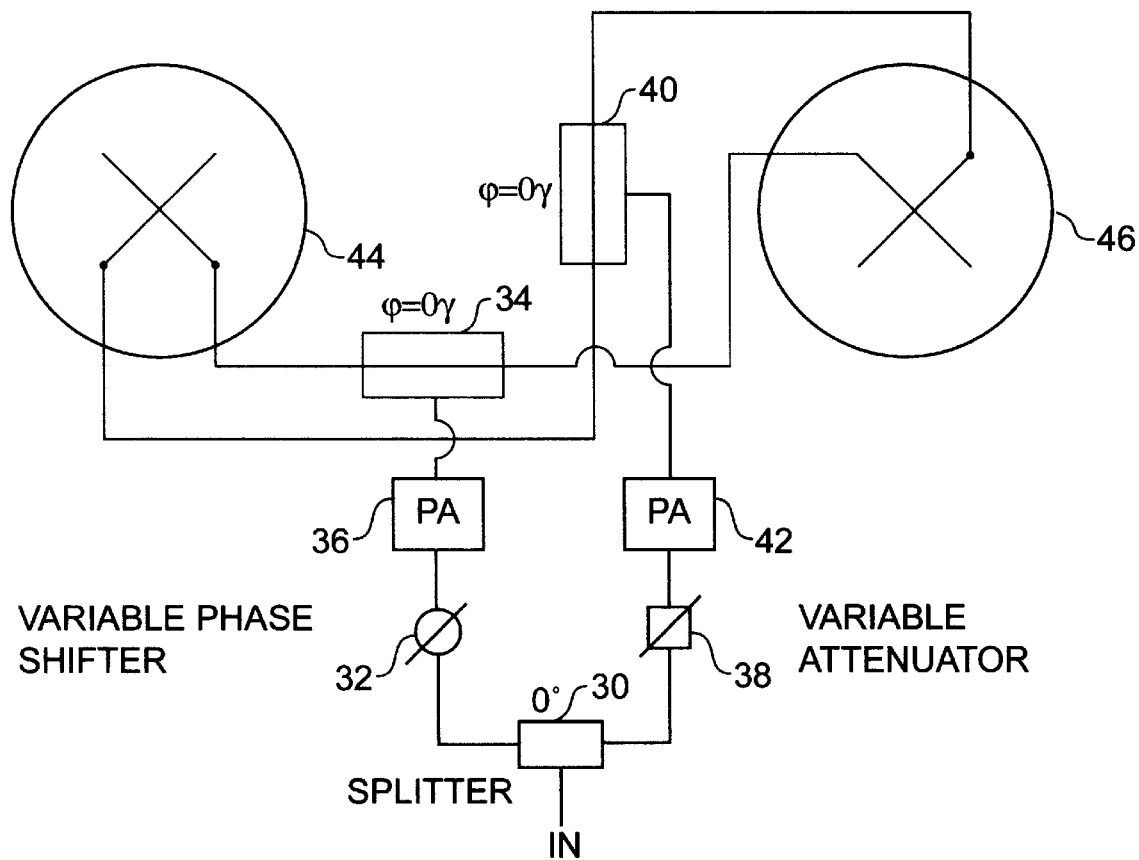
FIG. 3 shows a second embodiment of the quadrature transmitter of the present invention.

An alternative embodiment of the present invention is shown in FIG. 3. The RF input is split into two components at a first splitter 30, one of which undergoes a phase shift, the second of which is attenuated only. The first component is shifted in phase by a variable phase shifter 32 and passed to a splitter 34 via a first power amplifier 36. The second component is attenuated by a variable attenuator 38 and passed to a splitter 40 via a second power amplifier 42. Thus, each antenna 44, 46 receives identical phase-shifted and attenuated input signals.

The attenuator 38 and phase shifter 32 are first adjusted to produce a minimum NMR signal. Then, the phase is adjusted +/−180° to provide a maximum NMR signal.

Figure 4:
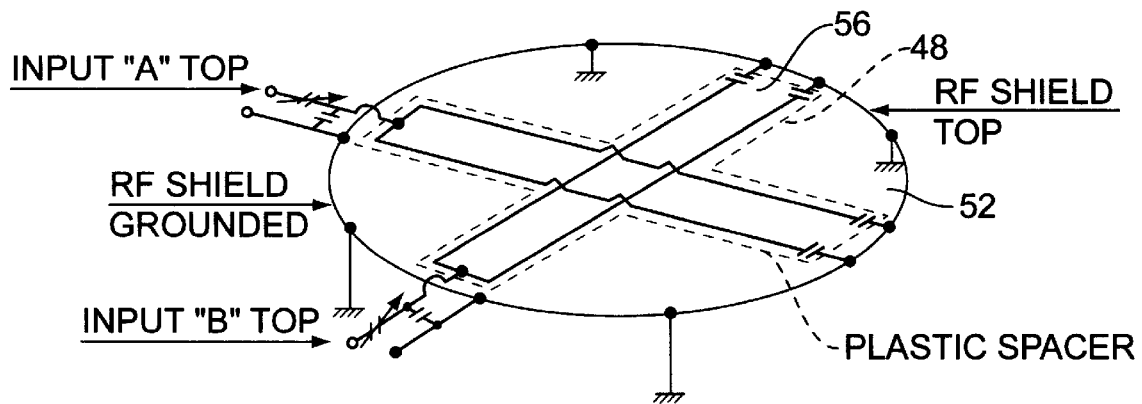
FIG. 4 shows a top quadrature transmitter coil.
Figure 5:
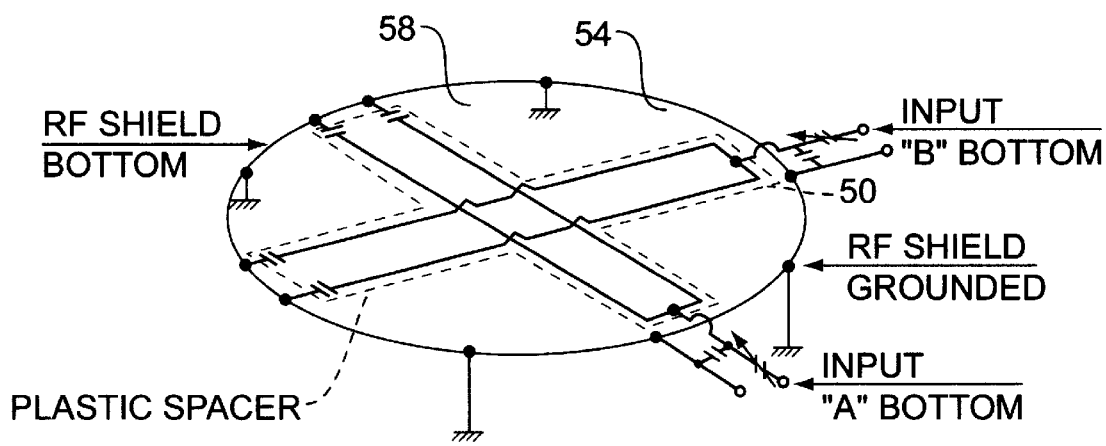
FIG. 5 shows a bottom quadrature transmitter coil.

As shown in the exemplary embodiment of FIGS. 4 and 5, each quadrature coil is mounted with the respective linear electrical conductor 49, 51 on a low density plastic cross 48, 50 (one for the bottom magnet pole face, one for the top magnet pole face) over the RF shield 52, 54 which covers the poles. The linear electrical conductors 49, 51 of the coils 56, 58 are preferably made from copper ribbon ½" wide and 10 mils thick. The thickness of the plastic forming the cross-shaped spacers 48, 50 is preferably ¾". The plastic crosses 48, 50 form the spacer 6 shown in cross section in FIG. 1. Each coil, top 56 and bottom 58, has two inputs A and B (inphase and quadrature). The RF shielding 52, 54 is grounded and acts as a current return for the coil 56, 58. In order to evenly distribute the current and avoid localized heating, the RF shield 52, 54 is grounded at multiple points.

Figure 6:
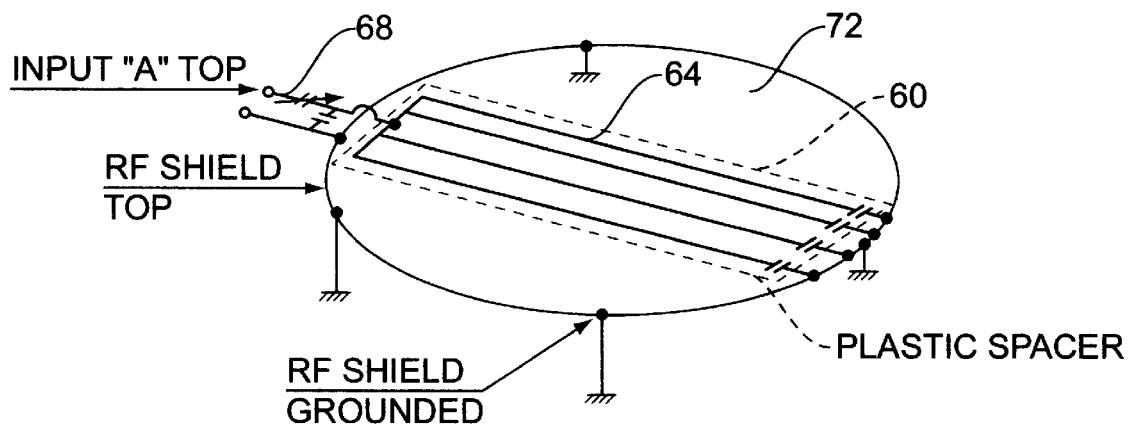
FIG. 6 shows a linear top transmitter coil using a shield as a return path.
Figure 7:
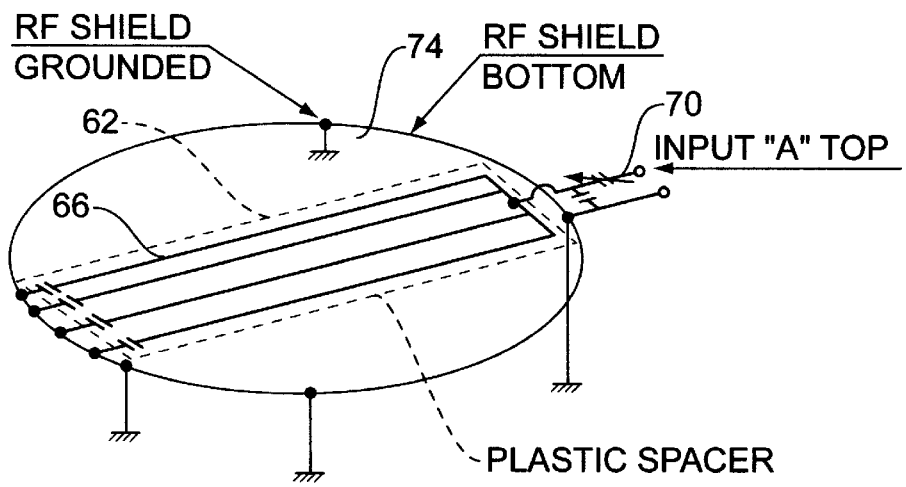
FIG. 7 shows a linear bottom transmitter coil using a shield as a return path.

FIGS. 6 and 7 show a more generalized embodiment of the antenna of the present invention to illustrate use of the RF shield as a current return in a linear coil. As shown, a plastic spacer 60, 62 for each coil 64, 66 is included to separate linear electrical conductor 61, 63 of the the coil 64,66 from the magnet core. Each coil 64, 66 includes an input terminal 68, 70 for receiving the RF signal, and an RF shield 72, 74, which is grounded to provide a current return for the signal carried by the coil 64, 66. In this general embodiment, a rectangular shape is shown for the exemplary plastic spacer. However, in the general case, the spacer may be formed in any suitable shape.

The present invention has been described by way of example and in terms of preferred embodiments. However, it is to be understood that the present invention is not strictly limited to the disclosed embodiments. To the contrary, various modifications, as well as similar arrangements, are included within the spirit and scope of the present invention. The scope of the appended claims, therefore, should be accorded the broadest possible interpretation so as to encompass all such modifications and similar arrangements.

What is claimed is:

1. An apparatus for generating an RF field, comprising:
   an input terminal for receiving an RF signal; and
   an integral antenna assembly, wherein the integral antenna assembly includes
      a linear electrical conductor disposed to receive the RF signal from the input terminal; and
      an RF shield formed of an electrically conductive material, coupled to and disposed under the linear electrical conductor and further including contacts for connection to a ground electrical potential;
      wherein the linear electrical conductor and the RF shield together form an electrically conductive loop, allowing current to flow in the antenna assembly to generate the RF field.

2. The apparatus of claim 1, further comprising an electrically non-conductive supporting element, on which the linear electrical conductor is disposed.

3. The apparatus of claim 2, wherein the supporting element is a plastic element.

4. The apparatus of claim 2, wherein the supporting element is formed in the shape of a rectangle.

5. The apparatus of claim 2, wherein the supporting element is cross-shaped.

6. The apparatus of claim 5, wherein the input terminal includes a first input terminal for receiving a first RF signal and a second input terminal for receiving a second RF signal, and the linear electrical conductor includes a first linear electrical conductor and a second linear electrical conductor.

7. The apparatus of claim 6, wherein
   the cross-shaped supporting element includes a first segment and a second segment,
   the first linear electrical conductor is disposed on the first segment to receive the first RF signal from the first input terminal, and
   the second linear electrical conductor is disposed on the second segment to receive the second RF signal from the second input terminal.

8. The apparatus of claim 7, further including an amplifier section having a splitter for receiving an input signal and producing the first RF signal, and for adding a phase shift to the input signal to produce the second RF signal.

9. The apparatus of claim 8, wherein the phase shift is 90°.

10. The apparatus of claim 7, wherein the amplifier section further includes a phase shifter for receiving an input signal and adding a phase shift to produce the first RF signal.

11. The apparatus of claim 10, wherein the phase shift is variable.

12. The apparatus of claim 7, wherein the amplifier section further includes an attenuator for receiving an input signal and providing attenuation to produce the second RF signal.

13. The apparatus of claim 12, wherein the attenuation is variable.

14. The apparatus of claim 13, wherein the attenuation is setable such that an amplitude of the first RF signal matches an amplitude of the second RF signal.

15. An MRI scanner having a patient-receiving area, comprising:
   a magnet; and
   an RF antenna disposed between the patient-receiving area and the magnet;
   wherein the RF antenna includes:
      an input terminal for receiving an RF signal;
      a linear electrical conductor disposed to receive the RF signal from the input terminal; and
      an RF shield formed of an electrically conductive material, coupled to and disposed under the linear electrical conductor and further including contacts for connection to a ground electrical potential;
      wherein the linear electrical conductor and the RF shield together form an electrically conductive loop, allowing current to flow in the antenna assembly to generate an RF field.

16. The MRI scanner of claim 15, further comprising an electrically non-conductive supporting element disposed on the magnet, wherein the input terminal is separated from the magnet by the supporting element.

17. The MRI scanner of claim 16, wherein the supporting element is a plastic element.

18. The MRI scanner of claim 16, wherein the supporting element is formed in the shape of a rectangle.

19. The MRI scanner of claim 16, wherein the supporting element is cross-shaped.

20. The MRI scanner of claim 19, wherein the input terminal includes a first input terminal for receiving a first RF signal and a second input terminal for receiving a second RF signal, and the linear electrical conductor includes a first linear electrical conductor and a second linear electrical conductor.

21. The MRI scanner of claim 20, wherein
   the cross-shaped supporting element includes a first segment and a second segment,
   the first linear electrical conductor is disposed on the first segment to receive the first RF signal from the first input terminal, and
   the second linear electrical conductor is disposed on the second segment to receive the second RF signal from the second input terminal.

22. The MRI scanner of claim 21, further including an amplifier section, which includes a splitter for receiving an input signal and producing the first RF signal, and for adding a phase shift to produce the second RF signal.

23. The MRI scanner of claim 22, wherein the phase shift is 90°.

24. The MRI scanner of claim 21, further including an amplifier section, which includes a phase shifter for receiving an input signal and adding a phase shift to the input signal to produce the first RF signal.

25. The MRI scanner of claim 24, wherein the phase shift is variable.

26. The MRI scanner of claim 21, further including an amplifier section, which includes an attenuator for receiving an input signal and providing attenuation to produce the second RF signal.

27. The MRI scanner of claim 26, wherein the attenuation is variable.

28. The MRI scanner of claim 27, wherein the attenuation is settable such that an amplitude of the first RF signal matches an amplitude of the second RF signal.

29. A method of providing an RF field for MRI scanning, comprising:
   generating an RF signal;
   providing the RF signal to a linear electrical conductor disposed on a magnet;
   shielding the linear electrical conductor using an RF shield formed of an electrically conductive material and coupled to the linear electrical conductor; and
   providing a sole current return for the RF signal through the RF shield, so that an electrically conductive loop is formed by the linear electrical conductor and RF shield together, to generate the RF field.

30. The method of claim 29, further comprising separating the linear electrical conductor from the magnet by an electrically non-conductive supporting element.

31. The method of claim 30, wherein the supporting element is a plastic element.

32. The method of claim 30, wherein the supporting element is formed in the shape of a rectangle.

33. The method of claim 30, wherein the supporting element is cross-shaped.

34. The method of claim 33, wherein the RF signal is a first RF signal and the linear electrical conductor is a first linear electrical conductor, the method further comprising:
   generating a second RF signal;
   providing the second RF signal to a second linear electrical conductor disposed on the magnet and separated from the magnet by the supporting element;
   shielding the second linear electrical conductor using the electrically conductive material; and
   providing a current return for the second RF signal through the RF shield.

35. The method of claim 34, wherein
   the cross-shaped supporting element includes a first segment and a second segment,
   the first linear electrical conductor is disposed on the first segment to receive the first RF signal from the first input terminal, and
   the second linear electrical conductor is disposed on the second segment to receive the second RF signal from the second input terminal.

36. The method of claim 35, further comprising generating a circularly polarized RF field at the first and second linear electrical conductors.

37. The method of claim 35, further including splitting an input signal to produce the first RF signal, and adding a phase shift to the input signal to produce the second RF signal.

38. The method of claim 37, wherein the phase shift is 90°.

39. The method of claim 35, further including receiving an input signal and adding a phase shift to produce the first RF signal.

40. The method of claim 39, wherein the phase shift is variable.

41. The method of claim 35, further including receiving an input signal and providing attenuation to produce the second RF signal.

42. The method of claim 41, wherein the attenuation is variable.

43. The method of claim 42, further comprising varying the attenuation until an amplitude of the first RF signal matches an amplitude of the second RF signal.

44. The method of claim 35, further comprising:
   receiving an input signal;
   adding a phase shift to the input signal to produce the first RF signal; and
   providing attenuation to the input signal to produce the second RF signal.

45. The method of claim 44, wherein providing attenuation includes providing attenuation such that an amplitude of the first RF signal matches an amplitude of the second RF signal.

46. The method of claim 44, further comprising:
   adjusting the phase shift and the attenuation so that an output field of the first and second linear electrical conductors produces a minimum NMR signal; and
   then adjusting the phase shift by ±180° to produce a maximum NMR signal.

* * * * *